(12) United States Patent
Wang et al.

(10) Patent No.: US 11,244,918 B2
(45) Date of Patent: Feb. 8, 2022

(54) MOLDED SEMICONDUCTOR PACKAGE AND RELATED METHODS

(71) Applicant: SEMICONDUCTOR COMPONENTS INDUSTRIES, LLC, Phoenix, AZ (US)

(72) Inventors: Sw Wang, Seremban (MY); CH Chew, Seremban (MY); Eiji Kurose, Oizumi-machi (JP); How Kiat Liew, Bukit Jalil (MY)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 609 days.

(21) Appl. No.: 15/679,666

(22) Filed: Aug. 17, 2017

(65) Prior Publication Data
US 2019/0057947 A1    Feb. 21, 2019

(51) Int. Cl.
*H01L 23/00* (2006.01)
*H01L 23/31* (2006.01)
*H01L 21/56* (2006.01)

(52) U.S. Cl.
CPC .............. *H01L 24/14* (2013.01); *H01L 21/56* (2013.01); *H01L 21/561* (2013.01); *H01L 23/3114* (2013.01); *H01L 24/96* (2013.01); *H01L 2924/0105* (2013.01); *H01L 2924/01029* (2013.01)

(58) Field of Classification Search
CPC ..... H01L 24/14; H01L 24/96; H01L 23/3114; H01L 2924/01029; H01L 2924/0105
See application file for complete search history.

(56) References Cited

U.S. PATENT DOCUMENTS

| | | | | |
|---|---|---|---|---|
| 6,579,748 | B1 * | 6/2003 | Okuno | H01L 21/561 257/E21.503 |
| 9,496,193 | B1 | 11/2016 | Roesner | |
| 2001/0018229 | A1 * | 8/2001 | Kato | H01L 21/56 438/106 |
| 2007/0026631 | A1 * | 2/2007 | Lin | H01L 23/3157 438/424 |
| 2007/0298603 | A1 * | 12/2007 | Rebibis | H01L 21/561 438/613 |
| 2008/0014677 | A1 | 1/2008 | Xiaochun | |
| 2009/0215227 | A1 | 8/2009 | Tan | |
| 2011/0233769 | A1 * | 9/2011 | Jobetto | H01L 23/3192 257/737 |
| 2011/0317385 | A1 * | 12/2011 | Zhou | H01L 23/3171 361/771 |

* cited by examiner

*Primary Examiner* — Peniel M Gumedzoe
(74) *Attorney, Agent, or Firm* — Adam R. Stephenson, Ltd.

(57) ABSTRACT

Implementations of semiconductor packages may include: a semiconductor die having a first side and a second side; one or more bumps included on the first side of the wafer, the bumps comprising a first layer having a first metal and a second layer including a second metal. The first layer may have a first thickness and the second layer may have a second thickness. The semiconductor package may also have a mold compound encapsulating all the semiconductor die except for a face of the one or more bumps.

16 Claims, 3 Drawing Sheets

MOLDED SEMICONDUCTOR PACKAGE AND RELATED METHODS

BACKGROUND

1. Technical Field

Aspects of this document relate generally to wafer level chip scale packages. More specific implementations involve optical image sensors and components in cellular phones including sensors, power management, and wireless capabilities.

2. Background

Wafer level packaging allows integration of wafer fab, packaging, test, and burn-in at wafer level in order to streamline the manufacturing process. Conventionally, to form a molded wafer level chip scale package (CSP), the plating of the terminal bumps is done after the over mold of the terminal is grinded down. This method requires an electroless or immersion plating process to plate the bumps.

SUMMARY

Implementations of semiconductor packages may include: a semiconductor die having a first side and a second side; one or more bumps included on the first side of the wafer, the bumps comprising a first layer having a first metal and a second layer including a second metal. The first layer may have a thickness of 10 microns and the second layer may have a thickness of 20 microns. The semiconductor package may also have a mold compound encapsulating all the semiconductor die except for a face of the one or more bumps.

Implementations of semiconductor packages may include one, all, or any of the following:

The first metal may be copper and the second metal may be tin.

The first metal may be one of silver, gold, copper, cadmium, palladium, rhodium or any combination thereof.

The second metal may be one of tin, silver, gold, copper, cadmium, palladium, rhodium or any combination thereof.

Implementations of a method of forming semiconductor packages may include: providing a wafer, the wafer having a first side and a second side; forming a plurality of bumps on the first side of the wafer, the bumps having a first layer and a second layer; forming one or more grooves between the bumps on the first side of the wafer, the one or more grooves having a predetermined depth into the wafer; overmolding the plurality of bumps with a mold compound; grinding the mold compound to expose a face of the plurality of bumps; grinding the second side of the wafer to singulate a plurality of die included in the wafer; overmolding the second side of the wafer; and singulating the mold compound between the plurality of die to form a plurality of semiconductor packages. The plurality of die may be fully encapsulated within the mold compound except for the face of the plurality of bumps.

Implementations of a method of forming semiconductor packages may include one, all, or any of the following:

The first layer of the bumps may include a first metal and the second layer of the bumps may include a second metal.

The first layer of the bumps may include copper and the second layer of the bumps may include tin.

The first layer of the bumps may be one of silver, gold, copper, cadmium, palladium, rhodium, and any combination thereof.

The second layer of the bumps may be one of tin, silver, gold, copper, cadmium, palladium, rhodium, and any combination thereof.

The first layer of the bumps may include a thickness of 10 microns and the second layer of the bumps may include a thickness of 20 microns.

The overmolding may include one of liquid dispensing, transfer molding, compression molding, and any combination thereof.

The one or more grooves may be formed through one of sawing and etching.

One of grinding the mold compound and grinding the second side of the wafer may each further include grinding through one of mechanical polishing and chemical mechanical planarization (CMP).

Implementations of a method of forming semiconductor packages may include: providing a wafer, the wafer having a first side and a second side; forming a first set of bumps on the first side of the wafer, the first set of bumps having a first metal; forming a second set of bumps on the first set of bumps, the second set of bumps having a second metal different from the first metal; sawing one or more grooves between the first set of bumps and the second set of bumps on the first side of the wafer; overmolding the first side of the wafer with a mold compound to encapsulate the first set of bumps and the second set of bumps; grinding the mold compound to expose a face of the second set of bumps; grinding the second side of the wafer to singulate a plurality of die included in the wafer; overmolding the second side of the wafer; and singulating the mold compound between the plurality of die to form a plurality of semiconductor packages. The plurality of die may be fully encapsulated within the mold compound except for the face of the second set of bumps.

Implementations of a method of forming a semiconductor packages may include one, all, or any of the following:

The first set of the bumps may include copper and the second set of bumps may include tin.

The first set of bumps may include one of silver, gold, copper, cadmium, palladium, rhodium, and any combination thereof.

The first set of bumps may have a thickness of 10 microns and the second set of bumps may include a thickness of 20 microns.

The overmolding may include one of liquid dispensing, transfer molding, compression molding, and any combination thereof.

One of grinding the mold compound and grinding the second side of the wafer may each further include grinding through one of mechanical polishing and chemical mechanical planarization (CMP).

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
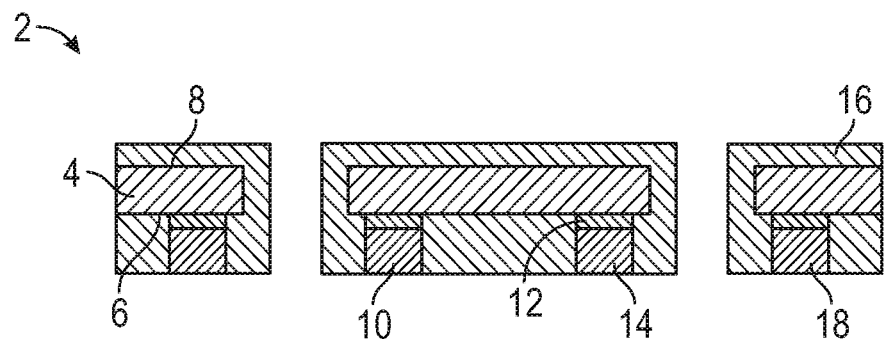
FIG. 1 is a cross sectional view of implementation of semiconductor packages as described herein.

Referring to FIG. 1, implementations of semiconductor packages 2 are illustrated. The packages 2 include a semiconductor die 4 having a first side 6 and a second side 8. The semiconductor die is formed from a semiconductor wafer. The packages 2 also include one or more bumps 10 on the first side 6 of the wafer. The bumps 10 have a first layer 12 including a first metal. The first layer 12 of the bumps may have a thickness of about 10 microns, though the thickness may be less than 10 microns or greater than 10 microns in various implementations. Coupled on the first layer 12 is a second layer 14. The second layer 14 includes a second metal. The second layer may have a thickness of about 20 microns though the thickness may be greater or less than 20 microns in various implementations. In some implementations, the thickness of the second layer may be a function of the thickness of the first layer 14. In other implementations, the thickness of the first layer may be greater than the thickness of the second layer provided the overall thickness of the two layers reaches a desired value. In various implementations, the first metal may include copper and the second metal may include tin. In other implementations, the first metal may be one of silver, gold, copper, cadmium, palladium, rhodium, any other suitable metal or electrically conductive material known in the art, or any combination or alloy thereof. Likewise, in other implementations, the second metal may be one of tin, silver, gold, cadmium, palladium, rhodium, any other suitable metal or electrically conductive material known in the art, or any combination or alloy thereof.

The semiconductor package 2, also includes a mold compound 16 encapsulating all the semiconductor die 4 except for a face 18 of the one or more bumps 10. Exposure of the face of the bumps allows the semiconductor package to electrically couple with a printed circuit board or other surfaces within an electronic device. By non-limiting example, semiconductor packages as described herein may be used in electronic devices such as cell phones, small electronics, vehicle systems, wireless devices, and the like.

Figure 2A:
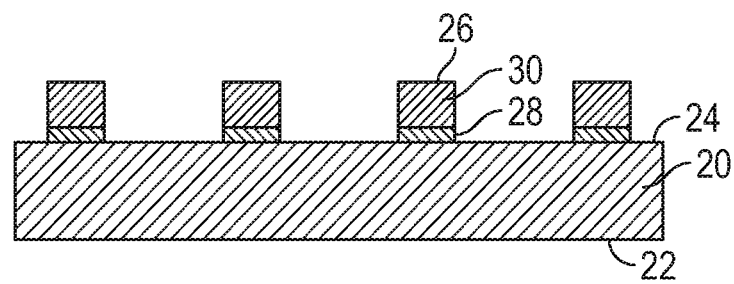
FIG. 2A is a cross sectional view of wafer having metals bumps thereon.

Referring now to FIGS. 2A-2G, an implementation of a method of forming semiconductor packages is illustrated. As illustrated in FIG. 2A, a wafer 20 having a first side 22 and second side 24 is provided. For illustrative purposes, only a section of a semiconductor wafer is illustrated. In practice the method described herein would process the entire surface of the semiconductor wafer. A plurality of bumps 26 are formed on the first side 24 of the wafer 20. The bumps 26 have a first layer 28 and a second layer 30. In other implementations of a method for forming semiconductor packages, two sets of bumps may be formed sequentially. A first set of bumps may be formed on the first side of the wafer. A second set of bumps may then be formed on the first set of bumps. The first layer 28 of the bumps 26 includes a first metal and may have a thickness of about 10 microns (or more or less, as previously discussed). The second layer 30 of the bumps includes a second metal and may have a thickness of about 20 microns (or more or less, as previously discussed). As previously described, the first metal may include copper and the second metal may include tin. In other implementations, the first layer 28 may include silver, gold, copper, cadmium, palladium, rhodium, or any combination or alloy thereof. The second layer may include, in various implementations, one of tin, silver, gold, copper, cadmium, palladium, rhodium, or any combination or alloy thereof. The first metal and the second metal may each include different metals or may the same metal or metal alloy.

Figure 2B:
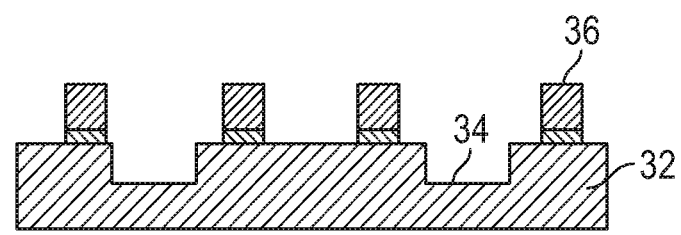
FIG. 2B is a cross sectional view of a wafer sawed on a first side.
Figure 2C:
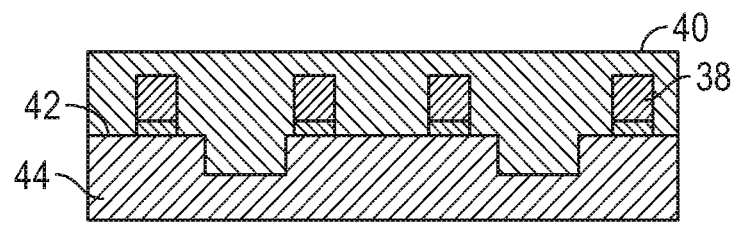
FIG. 2C is a cross sectional view of a wafer having a molding compound on a first side.

Referring to FIG. 2B, the wafer 32 is shown having one or more grooves 34 between the bumps 36 on the first side of the wafer. The one or more grooves 34 are formed a predetermined depth into the wafer. The grooves 34 may be formed through one of sawing and etching. Referring to FIG. 2C, overmolding the plurality of bumps 38 with a mold compound 40 is illustrated. In various implementations of the method of forming semiconductor packages, the overmolding may be done through one of liquid dispensing, transfer molding, compression molding, or any combination thereof. As illustrated, during the overmolding step the mold compound fills the grooves as well as the space between the bumps 36. The mold compound may be any of a wide variety of compounds, including epoxies, silicones, and any other material capable of providing structural support and/or prevention of ingress of contaminants into the semiconductor package.

Figure 2D:
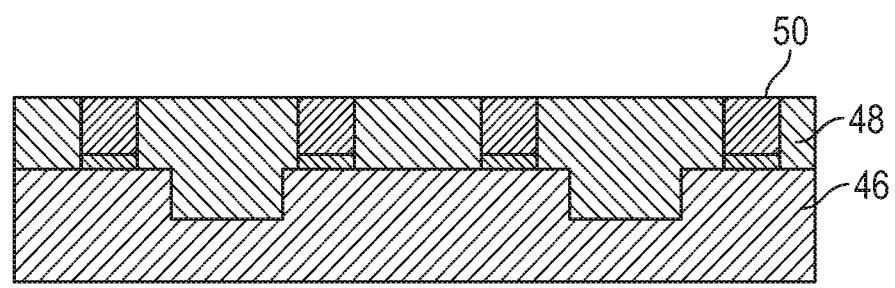
FIG. 2D is a cross sectional view of a wafer having metal bumps exposed through an overmold.
Figure 2E:
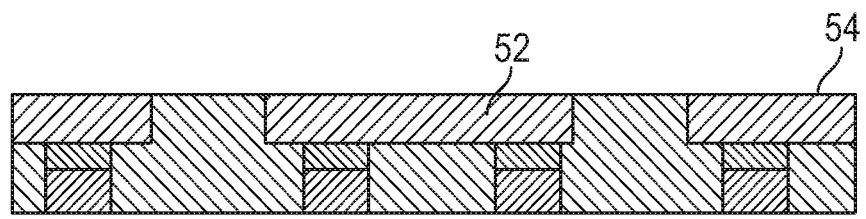
FIG. 2E is cross sectional view of a wafer after grinding a second side of the wafer.

Referring to FIG. 2D, the wafer 46 is illustrated after grinding the surface of the mold compound 48. The mold compound 48 is ground to expose a face of the plurality of bumps 50. Referring now to FIG. 2E, the wafer is shown after grinding the second side 54 of the wafer 52. As can be observed from FIG. 2E, the grinding of the wafer continues until the thickness of the wafer between the bottom of the grooves and the ground surface of the wafer is zero, serving to singulate the semiconductor die formed on and in the wafer itself. Grinding the mold compound and grinding the second side of the wafer may be done through one of mechanical polishing, mechanical grinding, and chemical mechanical planarization (CMP).

Figure 2F:
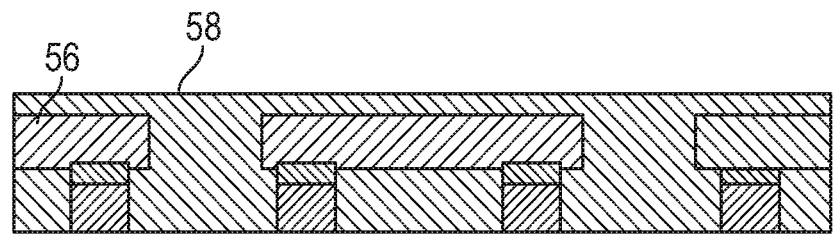
FIG. 2F is a cross sectional view of a wafer with a molding compound on a second side.
Figure 2G:
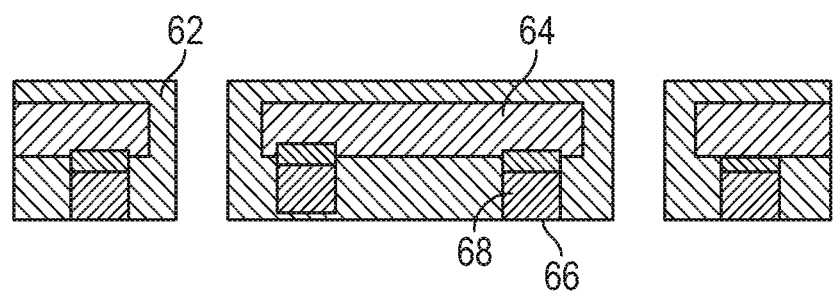
FIG. 2G is a cross sectional view of semiconductor packages after singulation.

Referring to FIG. 2F, the second side 56 of the wafer illustrated after overmolding with a mold compound 58. The overmolding may be done through one of liquid dispensing, transfer molding, compression molding, or any combination thereof. Referring to FIG. 2G, a plurality of semiconductor packages 60 are illustrated. The plurality of semiconductor packages 60 are then formed through singulating the mold compound 62 between the plurality of die 64. As can be seen in FIG. 2G, the edges/surfaces of the plurality of die 60 are fully encapsulated within the mold compound 62 except for the faces 66 of the plurality of bumps 68. The faces 66 of the plurality of bumps 68 remain exposed to allow electrical connection with electronic devices.

Because the back grinding of the die takes place while the die are encapsulated in mold compound, the wafer and die can be thinned to the depth of the grooves. In various implementations, the depth of the grooves can be set to about 10 microns or less. In other implementations, the depth of the grooves can be about 25 microns or less. In other implementations, the depth of the grooves could be 25 microns or more, depending upon the desired thickness of the resulting die. Use of the mold compound during the grinding step allows wafer processing issues resulting from high thinning of the wafer to be avoided, preventing wafer breakage and permitting thinner die to be created without requiring the use of additional wafer carriers (sacrificial or reusable). This may in turn result in fewer processing steps (such as carrier bonding/debonding operations) which will improve overall yield. Furthermore, the ability to fully encapsulate the die in mold compound on all sides of the die may allow the die to pass more stringent reliability tests, such as those used in automotive and other applications due to an improved ability to prevent ingress of water and other contaminants into the die material. Finally, the greater thickness of the bumps increases the amount of mold compound in the package which may serve to improve the structural support for the thinned die.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A method for forming semiconductor packages, the method comprising:
   providing a wafer, the wafer comprising a first side and a second side;
   forming a plurality of bumps on the first side of the wafer, the bumps comprising a first layer and a second layer;
   forming one or more grooves between the bumps on the first side of the wafer, the one or more grooves having a predetermined depth into the wafer;
   overmolding the plurality of bumps with a mold compound;
   grinding the mold compound to expose a face of the plurality of bumps;
   grinding the second side of the wafer to singulate a plurality of die comprised in the wafer;
   overmolding the second side of the wafer; and
   singulating the mold compound between the plurality of die to form a plurality of semiconductor packages, the plurality of die fully encapsulated within the mold compound except for the face of the plurality of bumps.

2. The method of claim 1, wherein the first layer of the bumps comprises a first metal and the second layer of the bump comprises a second metal.

3. The method of claim 1, wherein the first layer of the bumps comprises copper and the second layer of the bump comprises tin.

4. The method of claim 1, wherein the first layer of the bumps is one of silver, gold, copper, cadmium, palladium, rhodium and any combination thereof.

5. The method of claim 1, wherein the second layer of the bumps is one of tin, silver, gold, copper, cadmium, palladium, rhodium and any combination thereof.

6. The method of claim 1, wherein the first layer of the bumps comprises a thickness of 10 microns and the second layer of the bumps comprises a thickness of 20 microns.

7. The method of claim 1, wherein the overmolding comprises one of liquid dispensing, transfer molding, compression molding, and any combination thereof.

8. The method of claim 1, wherein the one or more grooves are formed through one of sawing and etching.

9. The method of claim 1, wherein one of grinding the mold compound and grinding the second side of the wafer each further comprise grinding through one of mechanical polishing and chemical mechanical planarization (CMP).

10. A method for forming semiconductor packages, the method comprising:
    providing a wafer, the wafer comprising a first side and a second side;
    forming a first set of bumps on the first side of the wafer, the first set of bumps comprising a first metal;
    forming a second set of bumps on the first set of bumps, the second set of bumps comprising a second metal different from the first metal;
    sawing one or more grooves between the first set of bumps and the second set of bumps on the first side of the wafer;
    overmolding the first side of the wafer with a mold compound to encapsulate the first set of bumps and the second set of bumps;
    grinding the mold compound to expose a face of the second set of bumps;
    grinding the second side of the wafer to singulate a plurality of die comprised in the wafer;
    overmolding the second side of the wafer; and
    singulating the mold compound between the plurality of die to form a plurality of semiconductor packages, the plurality of die being fully encapsulated within the mold compound except for the face of the second set of bumps.

11. The method of claim 10, wherein the first set of the bumps comprises copper and the second set of bumps comprises tin.

12. The method of claim 10, wherein the first set of bumps is one of silver, gold, copper, cadmium, palladium, rhodium and any combination thereof.

13. The method of claim 10, wherein the second set of the bumps is one of tin, silver, gold, copper, cadmium, palladium, rhodium and any combination thereof.

14. The method of claim 10, wherein the first set of bumps comprises a thickness of 10 microns and the second set of bumps comprises a thickness of 20 microns.

15. The method of claim 10, wherein the overmolding comprises one of liquid dispensing, transfer molding, compression molding, and any combination thereof.

16. The method of claim 10, wherein one of grinding the mold compound and grinding the second side of the wafer each further comprise grinding through one of mechanical polishing and chemical mechanical planarization (CMP).

* * * * *